US009411001B2

(12) United States Patent
Dijkstra

(10) Patent No.: US 9,411,001 B2
(45) Date of Patent: Aug. 9, 2016

(54) ANTENNA SYSTEM

(71) Applicants: L'Avenir d'Or BV, Montfoort (NL); Future BV, Driebruggen (NL)

(72) Inventor: Patrick Walter Joseph Dijkstra, Driebruggen (NL)

(73) Assignees: L'Avenir d'Or B.V., Montfoort (NL); Future B.V., Driebruggen (NL)

( * ) Notice: Subject to any disclaimer, the term of this patent is extended or adjusted under 35 U.S.C. 154(b) by 103 days.

(21) Appl. No.: 13/778,964

(22) Filed: Feb. 27, 2013

(65) Prior Publication Data

US 2014/0210486 A1 Jul. 31, 2014

(30) Foreign Application Priority Data

Jan. 29, 2013 (NL) ..................................... 1040028

(51) Int. Cl.

| | |
|---|---|
| ***G01R 29/08*** | (2006.01) |
| ***H01Q 5/42*** | (2015.01) |
| ***H01Q 5/20*** | (2015.01) |
| ***H01Q 3/30*** | (2006.01) |
| ***H01Q 3/28*** | (2006.01) |
| ***H01Q 25/00*** | (2006.01) |
| ***H01Q 21/06*** | (2006.01) |
| ***H01Q 21/29*** | (2006.01) |
| ***H01Q 23/00*** | (2006.01) |
| ***H01Q 21/30*** | (2006.01) |
| ***H01Q 21/08*** | (2006.01) |

(52) U.S. Cl.

CPC .................. *G01R 29/08* (2013.01); *H01Q 3/28* (2013.01); *H01Q 3/30* (2013.01); *H01Q 5/20* (2015.01); *H01Q 5/42* (2015.01); *H01Q 21/065* (2013.01); *H01Q 21/08* (2013.01); *H01Q 21/29* (2013.01); *H01Q 21/30* (2013.01); *H01Q 23/00* (2013.01); *H01Q 25/00* (2013.01)

(58) Field of Classification Search

CPC ...... H01Q 3/28; H01Q 5/0075; H01Q 21/065
See application file for complete search history.

(56) References Cited

U.S. PATENT DOCUMENTS

| | | | | |
|---|---|---|---|---|
| 6,091,365 | A * | 7/2000 | Derneryd et al. | 343/700 MS |
| 2001/0054983 | A1* | 12/2001 | Judd et al. | 343/810 |
| 2007/0280372 | A1* | 12/2007 | Egri | H04L 27/2637 375/267 |
| 2009/0004976 | A1* | 1/2009 | Shanjani | 455/82 |
| 2010/0103060 | A1* | 4/2010 | Au | 343/720 |
| 2010/0117917 | A1* | 5/2010 | Kindt | H01Q 13/08 343/843 |
| 2011/0109507 | A1* | 5/2011 | Warnick | 342/368 |
| 2011/0115665 | A1 | 5/2011 | Ryu | |

FOREIGN PATENT DOCUMENTS

EP 1626550 A2 2/2006

OTHER PUBLICATIONS

International Search Report PCT/ISA/210 and Written Opinion PCT/ISA/237 for International Application No. PCT/NL2014/050026 Dated Jul. 11, 2014.

Search Report and Written Opinion for Dutch Patent Application No. 1040028 dated Mar. 31, 2014 with English Translation.

* cited by examiner

*Primary Examiner* — Robert Karacsony
(74) *Attorney, Agent, or Firm* — Harness, Dickey & Pierce

(57) ABSTRACT

Broadband antenna system comprising a plurality of antenna elements and a plurality of amplifiers; wherein every antenna element of said plurality of antenna elements is configured for operating in a predetermined frequency range and is associated with an amplifier of said plurality of amplifiers which is configured for said predetermined frequency range; said plurality of antenna elements covering a broadband range.

22 Claims, 8 Drawing Sheets

ANTENNA SYSTEM

TECHNICAL FIELD

The technical field of the invention relates to antenna systems, in particular for EMC applications, and to antenna arrays for use in such systems.

BACKGROUND

At present, during electromagnetic compatibility (EMC) immunity testing, at the emitting side, a signal generator, a high power RF amplifier, and a broadband antenna are used to generate a broadband RF field, typically in an EMC room such as an anechoic chamber or a Faraday cage. These systems most commonly are used in the frequency ranges of 30 MHz to 1 GHz, 1 GHz to 6 GHz and 1 GHz to 18 GHz. More generally, any range between 20 MHz and 40 GHz can be used. In such a system typically the high power RF amplifier is located outside the EMC room and the broadband antenna is located inside the room. Typically, the RF power is generated through combining a number of low power amplifiers, wherein significant power losses may occur as a result of the combiners. Also, further power losses occur in the cable connection between the power amplifier outside the EMC room and the broadband antenna inside the room.

At the receiving side, typically a broadband antenna in combination with a preselector is used, where the preselector normally is part of the measurement receiver. Such a broadband receiving antenna typically has a limited gain and directivity, whilst being large, complex and expensive. The preselector comprises a plurality of band pass filters to remove broadband noise and out-of-band signals, and may further comprise a built-in amplifier.

SUMMARY

The object of embodiments of the invention is to achieve a more efficient way to generate and emit a broadband RF field, in particular for Radiated Immunity testing in EMC laboratories.

Embodiments of the invention provide an active antenna array for generation of a plurality of near-field electromagnetic fields in order to build up a homogeneous far-field electromagnetic field in front of the antenna. In other words, according to embodiments of the invention the emitted fields are combined (added or summed) in order to obtain the required homogeneous field in a broadband system, whilst in the broadband systems of the prior art the powers are combined before emitting, and the combined power is emitted through a single broadband antenna. Hence, embodiments of the invention have the advantage that the power losses can be reduced compared to the prior art systems.

The object of other embodiments of the invention is to achieve a more efficient way to receive a broadband RF field, in particular for Radiated Emission testing in EMC laboratories.

According to an aspect of the invention there is provided a broadband antenna system comprising a plurality of antenna elements and a plurality of amplifiers. Every antenna element of said plurality of antenna elements is configured for operating in a predetermined frequency range and is associated with an amplifier of said plurality of amplifiers which is configured for said predetermined frequency range. The plurality of antenna elements is selected such that a broadband range is covered.

When such an antenna system is used at the emitting side, the plurality of amplifiers is arranged to amplify signals generated by a signal amplifier, whereupon the amplified signals are emitted by the plurality of antenna elements. When used at the receiving side, the plurality of amplifiers is arranged to amplify signals received by the plurality of antenna elements.

In the context of the present application broadband refers to an operable range covering at least one octave. In other words, according to the invention e.g. the operable range of the antenna could be 1 to 2 GHz, or 1 to 6 GHz, or 80 to 160 MHz, etc.

The broadband range is preferably located in a range between 20 MHz and 100 GHz, more preferably in a range between 80 MHz and 18 GHz. Most preferably the broadband range is from 1 GHz to 6 GHz.

According to a possible embodiment the plurality of antenna elements comprises a first antenna element configured for operating in a first frequency range and a second antenna element configured for operating in a second frequency range different from the first frequency range. In such an embodiment the plurality of antenna elements may e.g. be narrowband antenna elements or narrowband antenna arrays operating in adjacent frequency ranges and/or in partly overlapping frequency ranges in order to cover the broadband range. Such an embodiment has the advantage that a broadband range may be covered using relatively simple antenna elements and amplifiers whilst limiting the power losses, due to the fact that both the antenna elements and the associated amplifiers can be narrowband, and no output combiner is required.

The plurality of antenna elements may e.g. comprise a plurality of patch antenna arrays, wherein the plurality of patch antenna arrays comprises at least a first antenna array configured for operating in a first frequency range and a second antenna array configured for operating in a second frequency range different from the first frequency range.

According to another possible embodiment the plurality of antenna elements are broadband antenna elements. Such an embodiment has the advantage that typically less antenna elements and amplifiers are required compared to the narrowband solution. Note that the plurality of broadband antenna element may comprise broadband antenna element operating in the same frequency range, or broadband antenna elements operating in different frequency ranges.

According to yet another embodiment, broadband antenna elements may be combined with narrowband antenna elements.

In a narrowband embodiment the plurality of antenna elements may comprise any one or more of the following types: patch antenna, dipole antenna. In a broadband solution the plurality of antenna elements may comprise any one or more of the following types: log per antenna, Vivaldi antenna, "bunny ear" antenna, horn antenna. Of course, also other appropriate antenna elements may be used for implementing the invention, as will be readily understood by the skilled person.

When the antenna system is used as a transmitting antenna system, preferably each amplifier of the plurality of amplifiers operates below 25 Watt, and preferably below 15 Watt, and most preferably below 10 Watt, and e.g. between 0.1 Watt and 10 Watt. In that way the amplifiers can be relatively simple and cheap compared to the broadband amplifier required in prior art solutions for broadband transmitting antenna systems. When the antenna system is used at the receiving side the plurality of amplifiers are typically amplifiers operating in the mW range.

When used at the emitting side, the broadband antenna system may further comprise control means for controlling the amplifiers in order to sequentially emit electromagnetic fields using the plurality of antenna elements, said sequentially emitted fields covering the full broadband range. The controlling means are preferably adapted to sequentially turn on groups of one or more amplifiers of the plurality of amplifiers. Also the broadband antenna system may comprise a plurality of power meters, wherein between each amplifier and the corresponding antenna element, there is provided a power meter.

Each amplifier is preferably integrated on the same PCB as the associated antenna element. This applies both for antenna systems at the emitting and at the receiving side. In that way, the distance between the amplifier and the antenna element can be kept very small, avoiding mismatches.

At the emitting side, the antenna system may comprise a power meter between each amplifier and antenna element. In that case the corresponding power meter is preferably also integrated on the same PCB. In that way, the distance between the amplifier and the antenna can be kept very small, avoiding mismatch and avoiding the need to measure the reflected power. In other words, in such embodiments each power meter may be adapted to measure only the forward power fed to the associated antenna. Further, in systems of the prior art there is typically required a mismatch protection, whilst in embodiments of the invention this protection may be omitted. The skilled person understands, that the invention is not limited to structures wherein each amplifier and/or power meter is integrated on the same PCB as the associated antenna, and that it is also possible to use e.g. separate PCB's or carriers with suitable interconnecting or coupling means.

When used at the receiving side, the broadband antenna system may further comprise a plurality of first band pass filters, wherein for each antenna element a band pass filter is placed after the amplifier. The band pass filter is preferably adapted to filter out broadband noise introduced by the amplifier. Further there may be arranged a second band pass filter between each antenna element and associated amplifier, in particular when the antenna elements are broadband antenna elements, in order to filter out broadband noise. Finally the broadband antenna receiving system typically comprises a combiner configured to combine the amplified, and possibly filtered, signals received at the plurality of antenna elements.

The plurality of antenna elements may be oriented in the same direction. Alternatively the antenna elements may be oriented in different directions in the same plane, wherein adjacent antenna elements are rotated over an angle which is preferably less than 60 degrees. According to yet another alternative the antenna elements may be located in different planes which, planes are oriented in different directions, the angle between adjacent planes being preferably less than 60 degrees.

Yet another object of the invention is to provide an antenna system that requires less power, is more accurate, and is less expensive compared to prior art systems, in particular for EMC applications.

According to another aspect of the invention there is provided an antenna system comprising a plurality of antenna elements and a plurality of amplifiers. Every antenna element of said plurality of antenna elements is configured for operating in a predetermined frequency range and is associated with an amplifier of said plurality of amplifiers which is configured for said predetermined frequency range. Further the antenna system comprises a plurality of phase shifters, wherein for each amplifier, there is arranged an associated phase shifter of the plurality of phase shifters.

When the antenna system is used at the emitting side, each phase shifter is preferably connected before the associated amplifier so that a signal of the signal generator is first shifted in phase, then amplified and then emitted by the corresponding antenna element. The plurality of phase shifters is preferably configured for obtaining an emitted field with a uniform field area as defined in the standard IEC61000-4-3, i.e. a field is considered uniform if its magnitude is within 0 to 6 dB of the nominal value for not less than 75% of all grid points of the field area. The field area is preferably at least 0.5 m by 0.5 m. The grid points are typically located at a distance of 0.5 m from each other. A typical field area would be 1.5 m by 1.5 m with 16 grid points located 0.5 m apart from each other. In that case the IEC61000-4-3 requirement is that at least 12 points of the 16 points are within the tolerance. Typically the amplifiers and phase shifters are configured in such a way that the uniform field area is located at a distance between 1 m and 10 m from the antenna elements. The antenna system may further comprise a controller configured for controlling the phase shifters in order to obtain a uniform field area as defined in the standard IEC61000-4-3 at a predetermined distance of the plurality of antenna elements, typically at a distance between 1 m and 10 m from the plurality of antenna elements. Typically it is desirable that the controller is configured for controlling the phase shifters in order to obtain a uniform field area for every frequency of the broadband range covered by the antenna system.

According to a preferred embodiment the antenna system may further comprise a plurality of attenuators, wherein for each amplifier, there is arranged an attenuator of the plurality of attenuators.

When the antenna system is used at the emitting side each attenuator is preferably connected between the associated amplifier and the associated phase shifter so that a signal of the signal generator is first shifted in phase, next attenuated, then amplified and finally emitted by the corresponding antenna element. The plurality of phase shifters and associated attenuators are preferably configured for obtaining an emitted field with a uniform field area as defined in the standard IEC61000-4-3, i.e. a field is considered uniform if its magnitude is within 0 to 6 dB of the nominal value for not less than 75% of all grid points of the field area. The field area is preferably at least 0.5 m by 0.5 m. The grid points are typically located at a distance of 0.5 m from each other. Typically the amplifiers, phase shifters and attenuators are configured in such a way that the uniform field area is located at a distance between 1 m and 10 m from the antenna elements. The antenna system may further comprise a controller configured for controlling the plurality of phase shifters and the plurality of attenuators in order to obtain a uniform field area as defined in the standard IEC61000-4-3 at a predetermined distance of the plurality of antenna elements, typically at a distance between 1 m and 10 m from the plurality of antenna elements.

According to a variant the antenna system may comprise a controller which is configured for controlling the plurality of phase shifters and/or the plurality of attenuators in order to move the emitted beam over a predetermined surface according to any one of the following techniques:

- moving the beam according to a random pattern across the surface;
- allowing to beam to scan the surface according to a predefined continuous movement, e.g. line per line as in a TV; such a technique allows to obtain the same effects as when using a mode stirred method whilst being less complex;
- allowing the beam to step across the surface, wherein parts of the surface are subsequently radiated on for a predetermined amount of time. In that way the complete surface can be covered step by step.

When the antenna system is used at the receiving side each phase shifter is preferably connected after the associated amplifier so that a signal by an antenna element is first amplified, and then shifted in phase. The plurality of phase shifters is preferably configured for being capable of changing the receiving direction of the antenna system so that a field emitted from a large area of an object can be received. The antenna system may further comprise a controller configured for controlling the phase shifters in function of the beam to be received. Further a plurality of attenuators may be provided. When the antenna system is used at the receiving side, each attenuator is preferably connected after the associated phase shifter so that a received signal is first amplified, next shifted in phase, and then attenuated. The controller may then be configured for controlling the plurality of phase shifters and the plurality of attenuators in order to be able to vary the receiving direction so that an accurate reception can be obtained, also when a large object is measured.

Note that the embodiment of the antenna system including the plurality of phase shifters and/or attenuators does not need to be a broadband antenna system and may also be a narrowband antenna system.

A further aspect of the invention relates to an antenna array arrangement, preferably configured for use in an embodiment of an antenna system of the invention. Such an antenna array arrangement may comprise at least a first array of at least two antenna elements, and a second array of at least two antenna elements, wherein the at least two antenna elements of the first array surround the at least two antenna elements of the second array. The antenna elements are preferably patch antennas, and may have various shapes. Possible shapes are e.g. rectangular, circular, oval, triangular, etc. The at least two antenna elements of the first and second array may be placed according to a first and second pattern, respectively, e.g. four rectangular antenna elements placed in the corners of a rectangle. The first pattern may be identical to the second pattern or different from the second pattern. Note that identical may refer to, example given, the fact that the antenna elements are placed in the corners of a rectangle or that the antenna elements are placed in the corners of a triangle. The first array may be configured to operate in a first frequency range, and the second array may be configured to operate in a second frequency range different from the first frequency range. The distance between two antenna elements of the first and second array is preferably approximately equal to a central wave length corresponding with the first and second frequency range, respectively. The dimension of the antenna elements of the first and second array (e.g. in case of a square, the size of a side of the square; or in case of a circle, the diameter) is preferably approximately equal to half a central wave length corresponding with the first and second frequency range, respectively.

Yet another aspect of the invention relates to the use of an embodiment of an antenna system as disclosed above for EMC applications, in particular applications wherein the antenna system is provided in an EMC room.

BRIEF DESCRIPTION OF THE FIGURES

The accompanying drawings are used to illustrate presently preferred non-limiting exemplary embodiments of devices. The above and other advantages of the features and objects will become more apparent and the invention will be better understood from the following detailed description when read in conjunction with the accompanying drawings, in which.

DETAILED DESCRIPTION OF EMBODIMENTS

According to embodiments of the invention a wideband antenna array is used where each individual antenna in the array is equipped with a medium power amplifier operating typically in a range below 25 Watt, and preferably between 0.1 Watt to 10 Watt. Such embodiments have the advantage that the fields, generated by the individual amplifier/antenna cells are added together after emission by the individual antennas of the array.

Compared to the conventional approach, where a high power amplifier and a single broadband antenna is used, the new approach has the advantage that the output power of individual medium power amplifiers does not need to be combined before transmission, as is typically the case in a high power, broadband amplifier system. Also the power losses are typically lower in embodiments of the invention. Indeed, according to the prior art, the combining of power is difficult to realize in a broadband amplifier and will result in significant losses in the combiner and in a poor frequency response. Furthermore, according to conventional techniques, the high power amplifier is typically arranged outside the EMC room, away from the antenna, thus requiring a long coax cable between the amplifier and the antenna. At high frequencies, this will result in considerable cable losses. On the contrary, according to embodiments of the invention such long cables are not required, and hence the losses can be further reduced. In conclusion, embodiments of the invention can result in a lower required overall RF power.

According to embodiments of the invention, the active antenna array may be combined with an integrated RF power meter, measuring forward power delivered to the antenna array. Preferably each antenna with its associated amplifier, and optionally with its associated power meter, may be provided on the same PCB in order to limit the dimensions of the connecting elements.

Figure 1A:
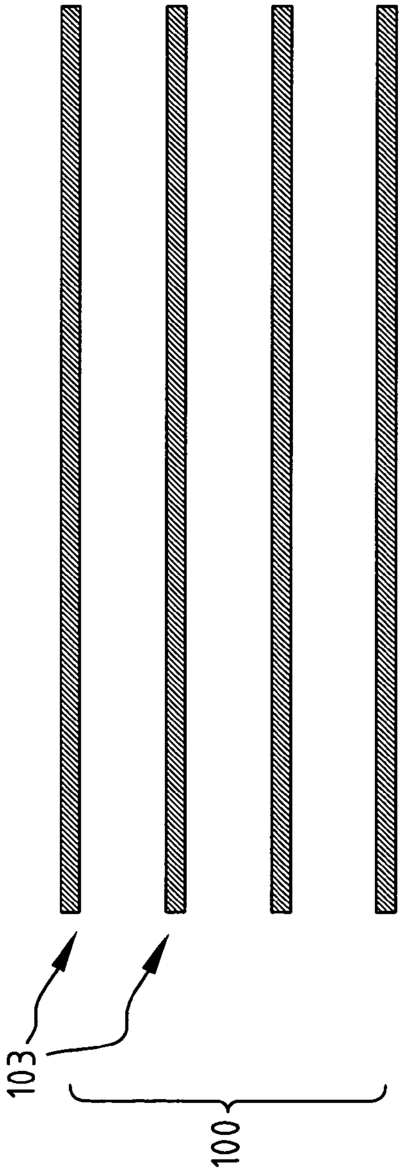
FIGS. 1A and 1B illustrate schematically a side view and a top view of a first exemplary embodiment of the invention, respectively.
Figure 1B:
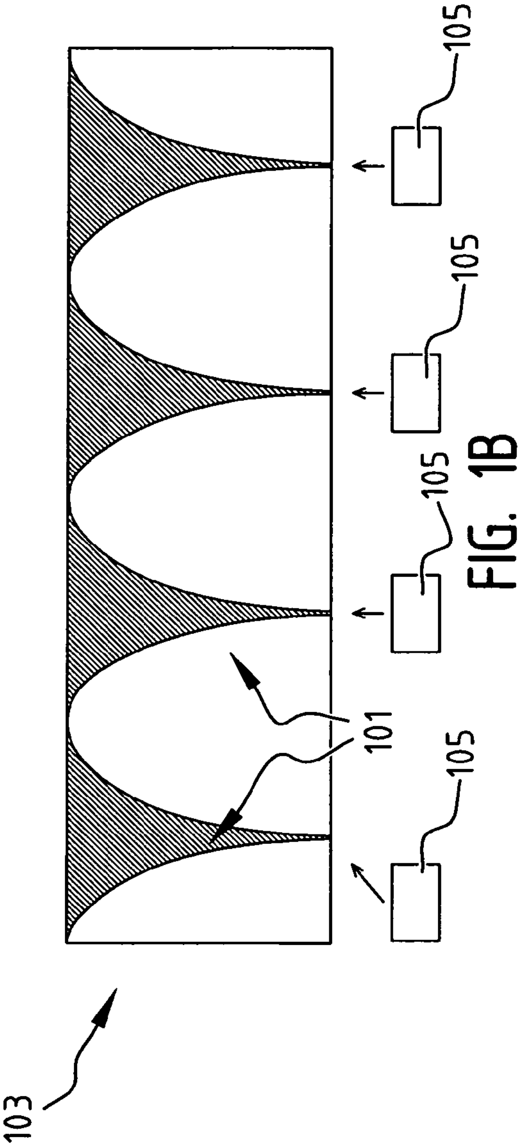

Now a first embodiment of an antenna array of the invention is discussed. The antenna array consists of a plurality of broadband antennas, such as log per antennas, Vivaldi antennas, or "bunny ear" antennas. In this embodiment, the number of medium power amplifiers may be the same as the number of antennas in the antenna array. An example of the first embodiment is illustrated in FIGS. 1A and 1B. The antenna array 100 is composed of four PCB substrates 103 each carrying four antennas 101. Four Vivaldi antennas 101 are provided on each PCB substrate 103. Each antenna 101 is coupled with a medium power amplifier 105. The amplifiers 105 are shown schematically, but the skilled person understands that an amplifier may be provided in the form of an amplifier chip which is mounted on the same PCB as the associated antenna element.

Figure 2:
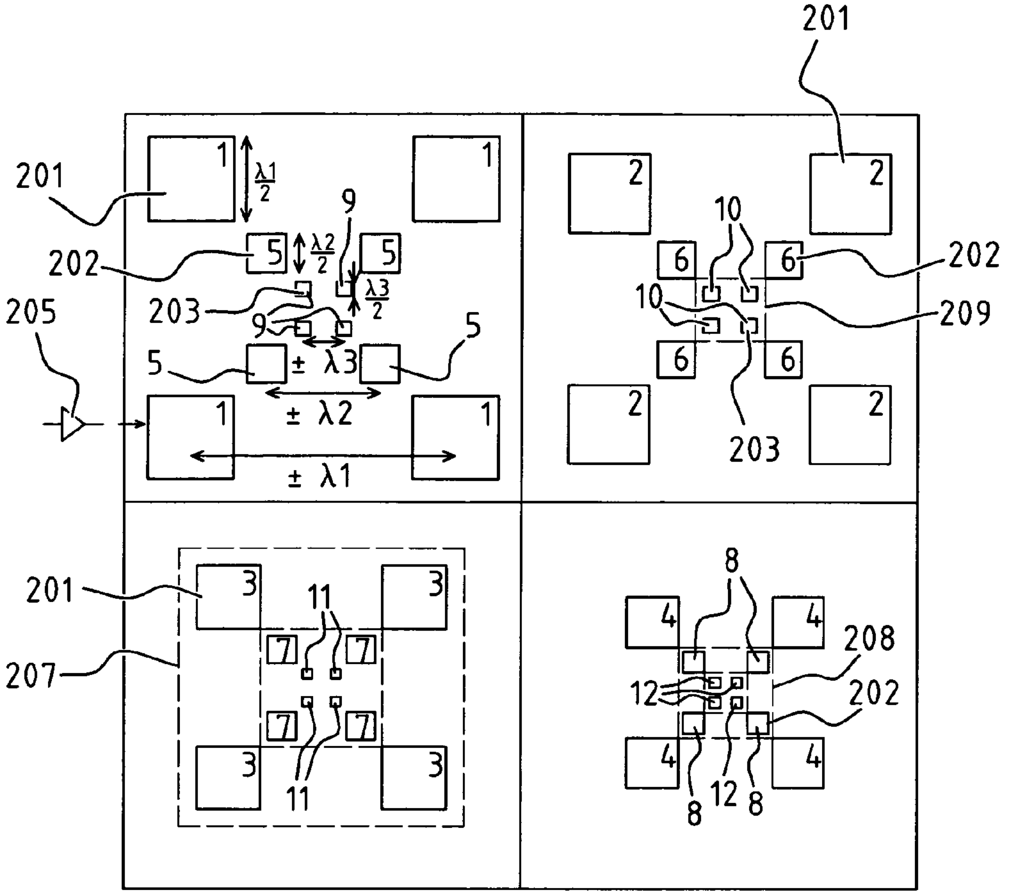
FIG. 2 illustrates schematically a top view of a second exemplary embodiment of the invention.

Now a second embodiment of an antenna array of the invention is discussed. The antenna array consists of a plurality of narrowband antenna arrays, typically a high number of narrowband antenna arrays, wherein each narrow band antenna array covers a different part of the required total frequency band. Each narrowband antenna array may consist e.g. of 2 or more antenna elements. The narrowband antenna elements may be e.g. patch antennas or dipole like antennas. These narrowband antennas typically have a higher gain compared to the broadband antennas. The tradeoff of this approach is that a higher number of amplifiers is required, taking into account that typically every patch antenna requires an amplifier. An example of the second embodiment is illustrated in FIG. 2. FIG. 2 shows a typical setup of a multi array approach with four times twelve antenna elements 201, 202, 203 coupled with four times twelve medium power amplifiers 205. For clarity reasons only one amplifier 205 is shown.

The resonant frequencies of each array 207, 208, 209 of four antenna elements 201, 202, 203 is determined by the dimensions of the patch antenna used, typically a half wavelength, see λ1/2, λ2/2, λ3/2 in FIG. 2. This results in decreasing dimensions for increasing frequency. When such a patch element 201, 202, 203 is placed in an array 207, 208, 209, the distance between elements of the same resonant frequency is preferably approximately one wavelength apart, see λ1, λ2, λ3 in FIG. 2. In general, this may lead to overlapping patches when the resonant frequencies are chosen close to each other, which is typically a requirement with narrowband antennas. To solve this, a setup as shown in FIG. 2 can be used. In this case for each frequency an array 207, 208, 209 of two by two elements 201, 202, 203 is used, and a total of twelve narrowband arrays is combined in such a way that elements do not overlap.

The skilled person will understand that many variations exist for the second embodiment of the invention. E.g. the narrowband arrays may comprise more or less than four antenna elements and those elements may be arranged according to any suitable pattern. Also more or less than twelve narrowband arrays may be provided and those arrays may be arranged in any suitable manner, e.g. adjacent each other, above one another, etc. The exemplary embodiment of FIG. 2 may be e.g. further developed/modified to obtain a configuration in which the patch antennas are (partly) on top of each other or arranged in different substrate layers.

In the exemplary embodiment of FIG. 2, for example, the frequencies mentioned below can be used for the individual antenna arrays, wherein the array numbers are indicated in FIG. 2.

| Array number: | Resonant frequency |
|---|---|
| 1 | 0.90 GHz |
| 2 | 1.08 GHz |
| 3 | 1.30 GHz |
| 4 | 1.56 GHz |
| 5 | 1.87 GHz |
| 6 | 2.24 GHz |
| 7 | 2.69 GHz |
| 8 | 3.22 GHz |
| 9 | 3.87 GHz |
| 10 | 4.64 GHz |
| 11 | 5.57 GHz |
| 12 | 6.69 GHz |

The example of FIG. 2 is only one of a large number of possible solutions. One can increase or decrease the number of antennas in an array to change e.g. the overall gain of an individual frequency band array, or change the number of individual frequency arrays, depending e.g. on the bandwidth of the individual antenna used.

Figure 2A:
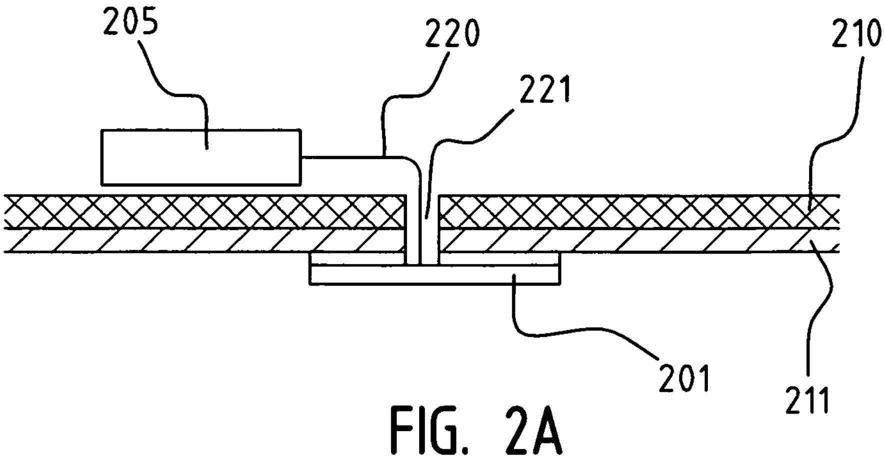
FIG. 2A illustrates schematically a possible arrangement for connecting an amplifier to an associated patch antenna element in an embodiment of the invention.

FIG. 2A illustrates how a patch antenna 201 may be connected to an associated amplifier 205. In this example the amplifier 205 is provided on a first side of a PCB 210, and the patch antenna 201 is provided on a second side of the PCB 210 on top of a ground plane 211. The output of the amplifier 205 is connected, e.g. using a bond wire 220, with the antenna 201 through a via 221. When antenna elements 201 are placed on different layers, these can be either directly fed elements or parasitic elements fed by an opposite antenna element. E.g., for the example of FIG. 2 arrays 1, 5 and 9 may be provided on a first substrate and arrays 2, 6 and 10 on a second substrate below the first substrate. In this case, e.g. the antenna elements of array 1 could be fed directly, and the antenna elements of array 2 could be fed through the antenna elements of array 1, etc.

Figure 3:
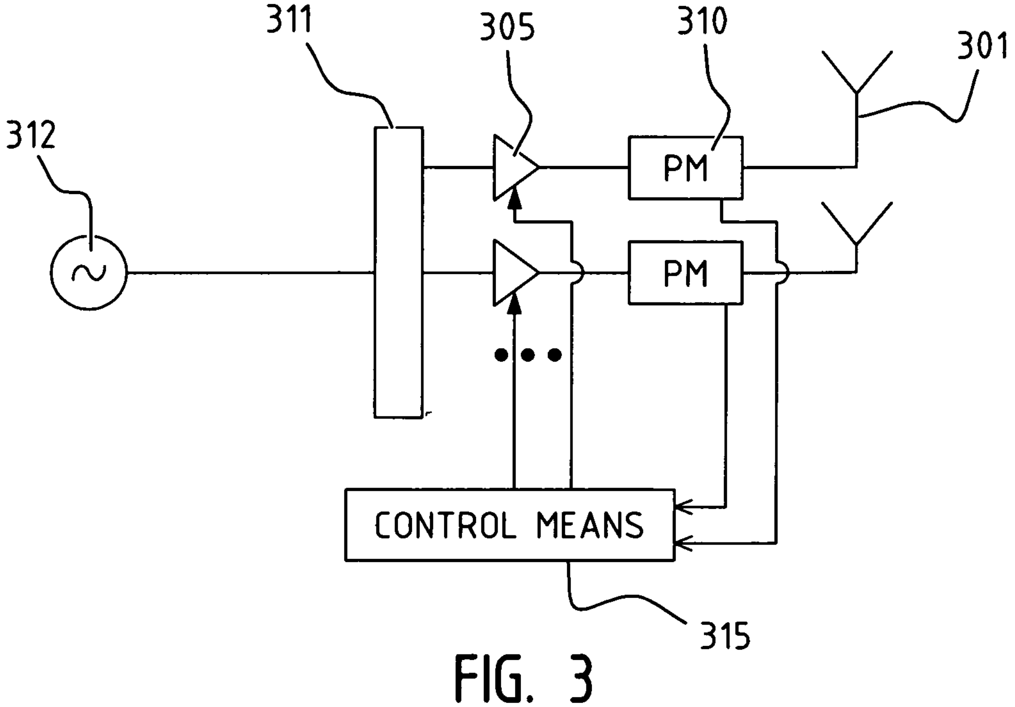
FIG. 3 illustrates schematically an embodiment of an antenna system of the invention, at an emitting side.

FIG. 3 illustrates schematically an embodiment of a broadband antenna system of the invention. The broadband antenna system comprises a plurality of antenna elements 301, a plurality of amplifiers 305, a plurality of power meters 310, a power splitter 311, and a signal generator 312. Every antenna element 301 is configured for operating in a predetermined frequency range and is associated with an amplifier 305 which is configured for operating in said predetermined frequency range. The plurality of antenna elements 301 and associated amplifiers 305 cover a broadband range, e.g. 1-6 GHz. Control means 315 are provided for controlling the amplifiers 305 to emit in a sequential way signals covering the full broadband range, e.g. step by step. Of course, the skilled person understands that such a step by step control only applies for embodiments where the antenna elements cover different frequency ranges and not for embodiments where the antenna elements are identical broadband antenna elements. Further, the control means 315 may be adapted to gather measurements from the power meters 310. Preferably the power meters 310, the amplifiers 305 and the splitter 311 are provided on one or more carriers, typically one or more PCB's, which can be provided in the EMC room. Optionally the signal generator 312 may also be provided on one of the PCB's, inside the EMC room.

Figure 4:
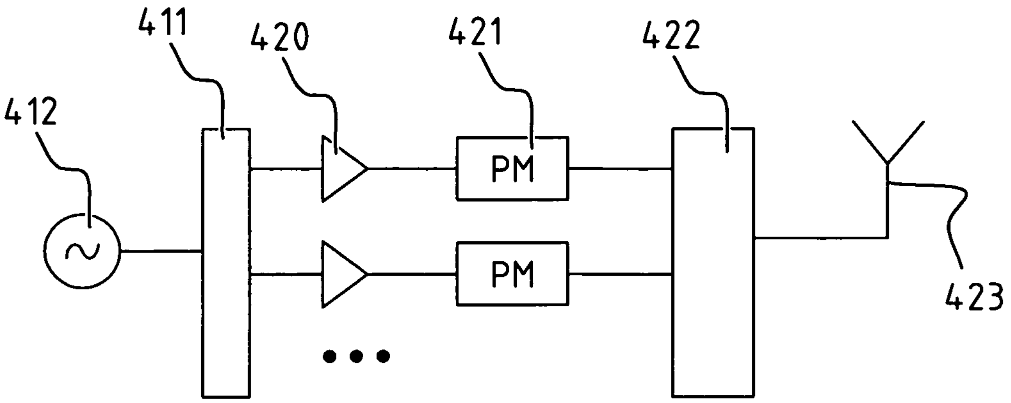
FIG. 4 illustrates schematically an embodiment of an antenna system of the prior art, at an emitting side.

For comparison, FIG. 4 illustrates schematically an embodiment of a transmitting broadband antenna system of the prior art. The broadband antenna system comprises a single broadband antenna 423, a plurality of amplifiers 420, a combiner 422, a plurality of power meters 421, a power splitter 411, and a signal generator 412. The broadband antenna 423 is configured for operating in the full broadband range. According to prior art solutions only the antenna 423 is located inside the EMC room, and the other components 411, 412, 420, 421, 422 are located outside the EMC room.

Figure 5:
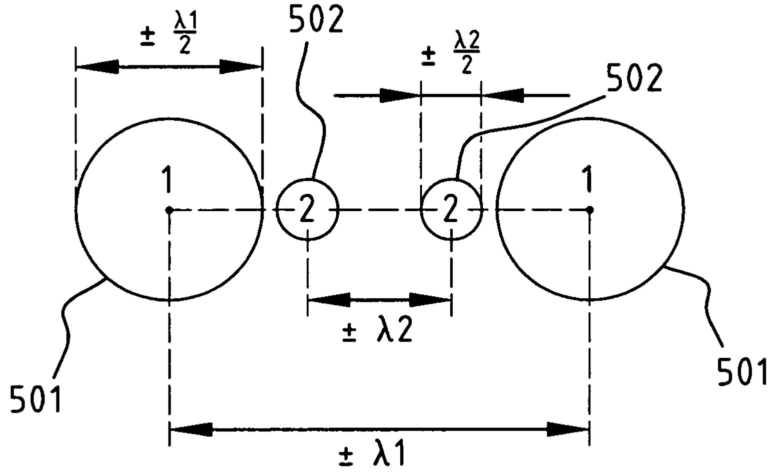
FIG. 5 illustrates schematically an embodiment of an antenna array of the invention.

FIG. 5 illustrates schematically another embodiment of an antenna array arrangement comprising a first array of two antenna elements 501, and a second array of two antenna elements 502. The two antenna elements 501 of the first array surround the two antenna elements 502 of the second array. The antenna elements 501, 502 are patch antennas. The first array is configured to operate in a first frequency range, and the second array is configured to operate in a second higher frequency range. The distance between two antenna elements of the first and second array is approximately equal to a wave length λ1, λ2 corresponding with the first and second frequency range, respectively. The dimension of the antenna elements 501, 502, here the diameter, is approximately equal to half the wave length λ1/2, λ2/2 corresponding with the first and second frequency range, respectively.

Although the figures only illustrate antenna array arrangements with arrays with four elements (FIG. 2) or with two elements (FIG. 5), the skilled person understands that an array may have also three or more than four antenna elements. Also different arrays of the same array arrangement may have a different number of antenna elements.

Figure 6:
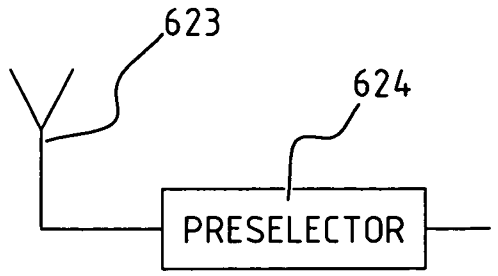
FIG. 6 PRIOR ART
FIG. 6 illustrates schematically an embodiment of a broadband antenna system of the prior art, at a receiving side.

FIG. 6 illustrates an antenna system at the receiving side according to the prior art. The system comprises a broadband antenna 623 in combination with a preselector 624. Such a broadband receiving antenna is for example a biconical antenna, a log periodic antenna or a horn antenna, having a low sensitivity (poor gain) and is typically large, complex and expensive. The preselector comprises a plurality of band pass filters to remove broadband noise and out-of-band signals, and may further comprise a built-in amplifier increasing the overall sensitivity.

Figure 7:
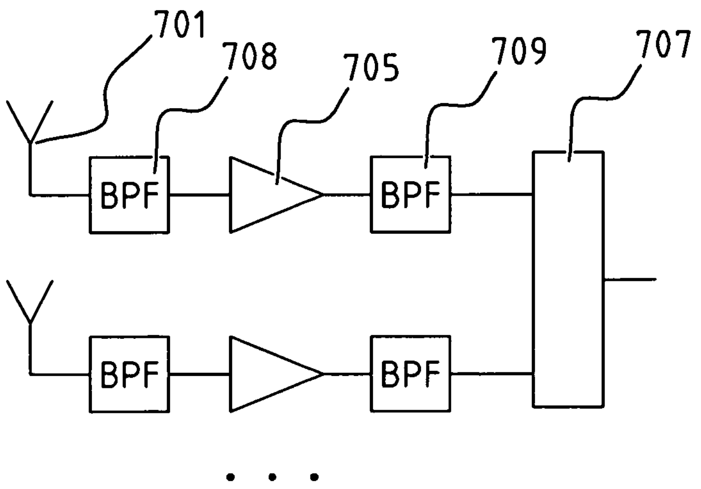
FIG. 7 illustrates schematically an embodiment of a broadband antenna system of the invention, at a receiving side.

FIG. 7 illustrates an embodiment of a broadband antenna system used at the receiving side, comprising a plurality of antenna elements 701, a plurality of amplifiers 705, and a combiner 707. Every antenna element 701 is configured for operating in a predetermined frequency range and is associated with an amplifier 705 which is configured for operating in said predetermined frequency range. The plurality of antenna elements 701 and associated amplifiers 705 cover a broadband range, e.g. 1-6 GHz. Control means (not shown) may be provided for controlling the amplifiers 705, such that each amplifier (for a certain frequency band) can be switched on, the moment the measurements in this frequency range are carried out. The system further contains a plurality of first band pass filters 709, wherein for each antenna element a band pass filter 709 is placed between the amplifier 705 and the combiner 707. The band pass filter 709 is preferably adapted to filter out noise introduced by the amplifier. Further, optionally a second band pass filter 708 may be connected between each antenna element 701 and associated amplifier 705, in particular when the antenna elements are broadband antenna elements, in order to filter out broadband noise and increase the dynamic range of the system (for broadband signals). Preferably the band pass filters 708, 709, the amplifiers 705 and the antenna elements 701 are provided on one or more carriers, typically one or more PCB's, which can be provided in the EMC room.

Figure 8:
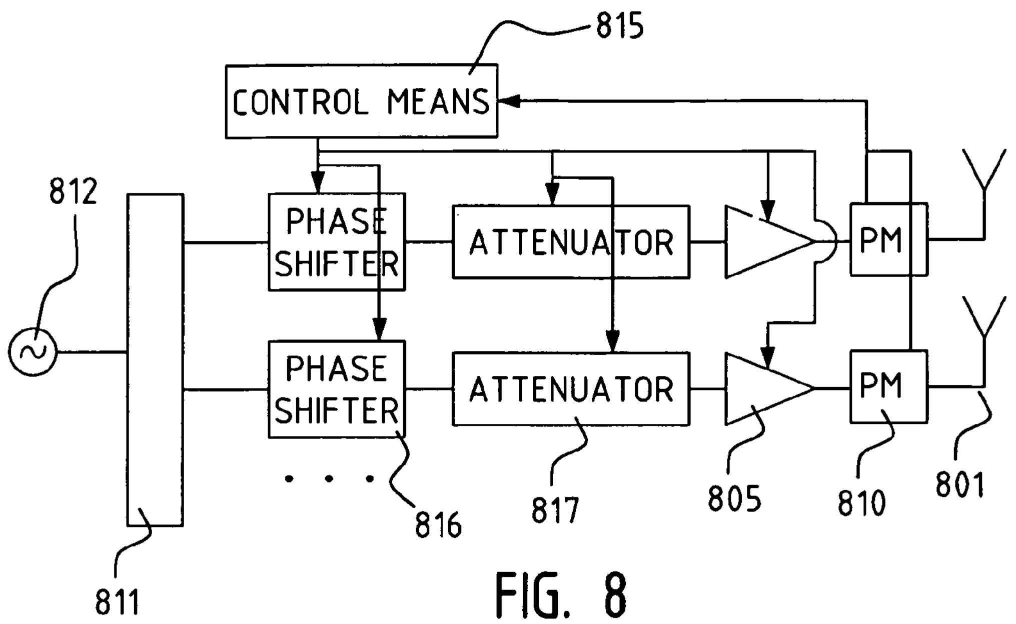
FIG. 8 illustrates schematically an embodiment of a antenna system with phase shifters, at an emitting side.

FIG. 8 illustrates schematically a further developed embodiment of an antenna system of the invention at an emitting side. The antenna system comprises a plurality of antenna elements 801, a plurality of amplifiers 805, a plurality of power meters 810, a power splitter 811, and a signal generator 812. Every antenna element 801 is configured for operating in a predetermined frequency range and is associated with an amplifier 805 which is configured for operating in said predetermined frequency range. Further the antenna system comprises a plurality of phase shifter 816 and a plurality of attenuators 817. Between the power splitter 811 and each amplifier 805, there is arranged an associated phase shifter 816 in series with an attenuator 817, so that a power signal of the signal generator is first shifted in phase, next attenuated and then amplified and emitted by the corresponding antenna element 801. The plurality of phase shifters 816 and attenuators are preferably configured and controlled for obtaining an emitted field with a uniform field area as defined in the standard IEC61000-4-3, i.e. a field area is considered uniform if its magnitude is within 0 to 6 dB of the nominal value for not less than 75% of all grid points of the field area. The field area is preferably between 0.5 m by 0.5 m and 3 m by 3 m. The grid points are typically located at a distance of 0.5 m from each other. A typical field area would be 1.5 m by 1.5 m with 16 grid points located 0.5 m apart from each other. Typically the amplifiers and phase shifters are configured in such a way that the uniform field area is located at a distance between 1 m and 10 m from the antenna elements, e.g. 3 m for a small EMC room, 5 m for an average EMC room and 10 m for a large EMC room. The antenna system may further comprise a controller 815 configured for controlling the phase shifters 816 and attenuators 817 in order to obtain a uniform field area as defined in the standard IEC61000-4-3 at a predetermined distance of the plurality of antenna elements, typically at a distance between 1 m and 10 m from the plurality of antenna elements. The control means 815 may also control the amplifiers 805 to emit in a sequential way signals covering the full frequency range, e.g. step by step. Further, the control means 815 may be adapted to gather measurements from the power meters 810. Preferably the power meters 810, the amplifiers 805, the phase shifters 816, the attenuators 817 and the splitter 811 are provided on one or more carriers, typically one or more PCB's, which can be provided in the EMC room. Optionally the signal generator 812 may also be provided on one of the PCB's, inside the EMC room.

Figure 9:
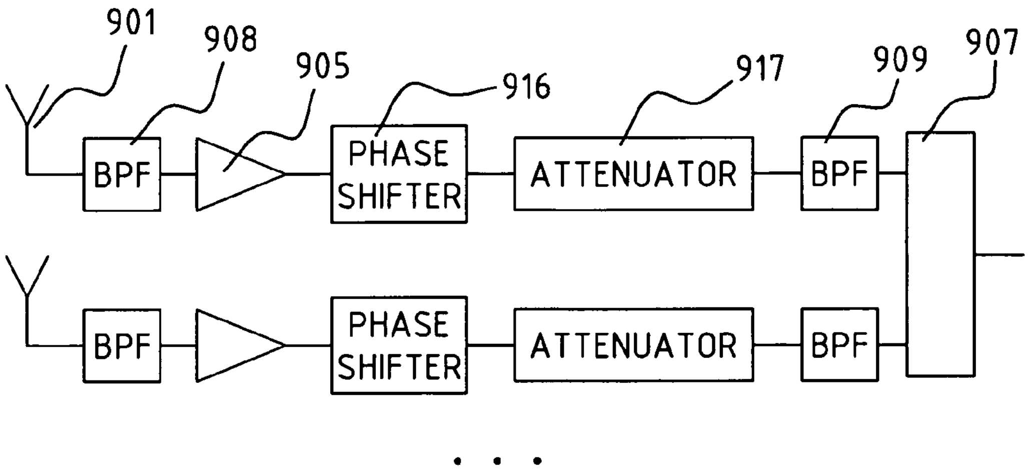
FIG. 9 illustrates schematically an embodiment of a antenna system with phase shifters, at a receiving side.

FIG. 9 illustrates a similar embodiment of an antenna system for the receiver side. The antenna system comprises antenna elements 901 for receiving an emitted field, an optional band pass filter 908, an amplifier 905, a further band pass filter 909 and a combiner 907. For each antenna element 901, a phase shifter 916 and an attenuator 917 are connected in series between the associated amplifier 905 and the further band pass filter 909 so that a signal received by an antenna element is first filtered, next amplified, then shifted in phase and attenuated, and again filtered. The antenna system may further comprise control means (not shown) for controlling the amplifiers 905, the phase shifters 916, and the attenuators 917 in function of the field to be received.

Note that the embodiments of FIGS. 8 and 9 do not need to be broadband antenna systems and may also be narrowband antenna systems.

Figure 10:
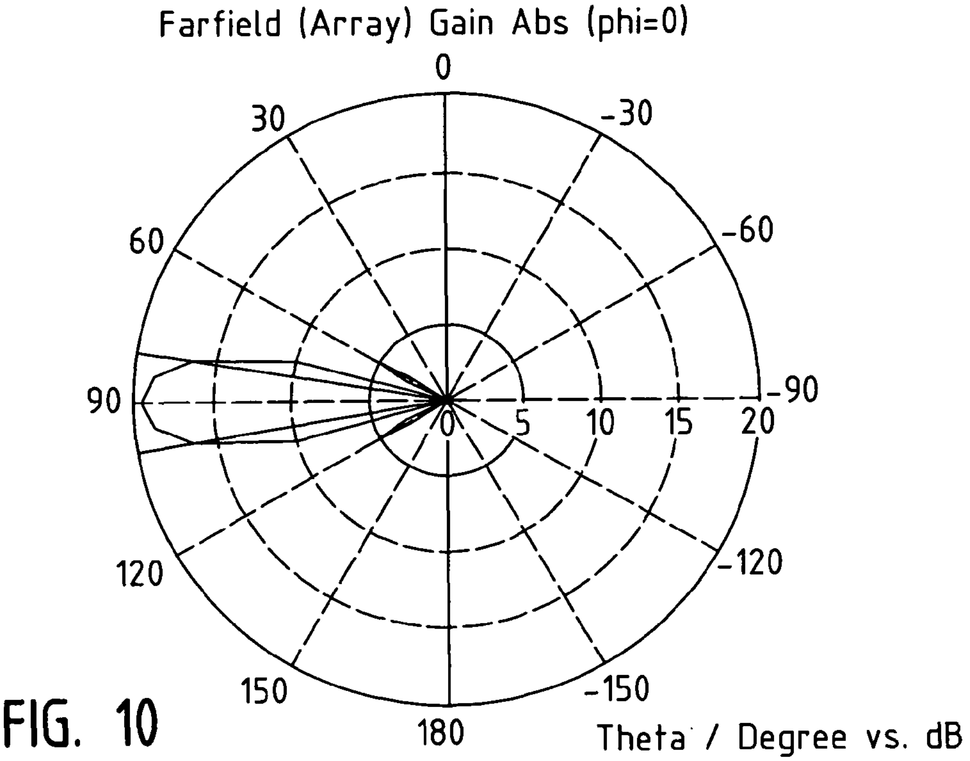
FIG. 10 is a first beam diagram illustrating the simulated gain of a beam in function of the direction (angle) for an embodiment of an emitting antenna system of the invention.
Figure 11:
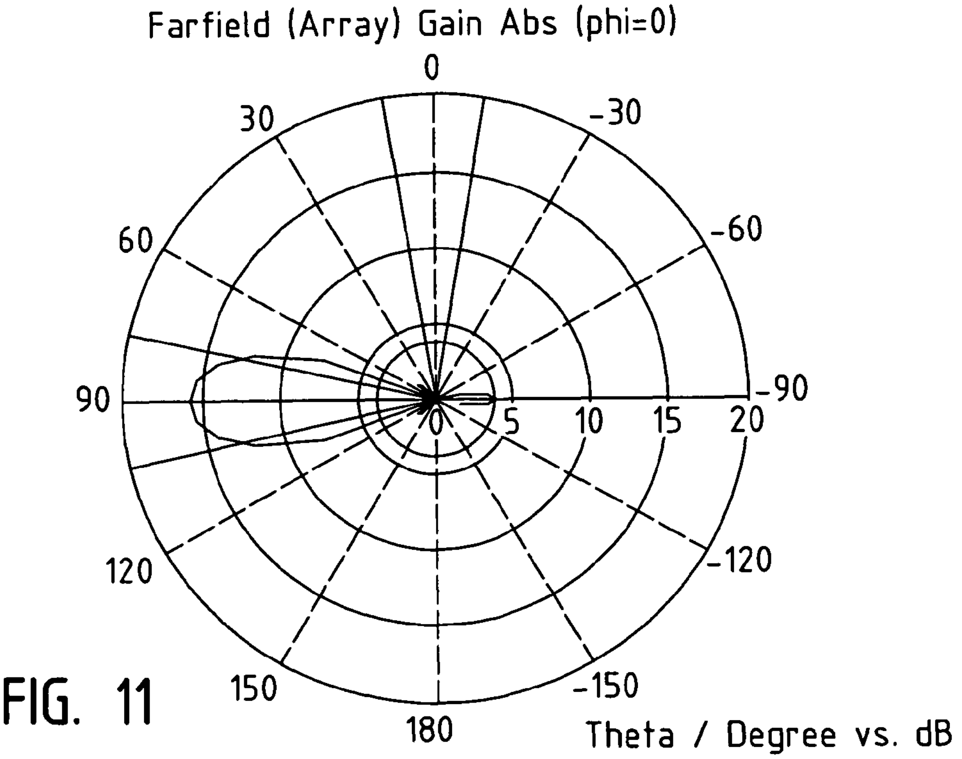
FIG. 11 is a second beam diagram illustrating the simulated gain of a beam in function of the direction (angle) for an embodiment of an emitting antenna system of the invention.
Figure 12:
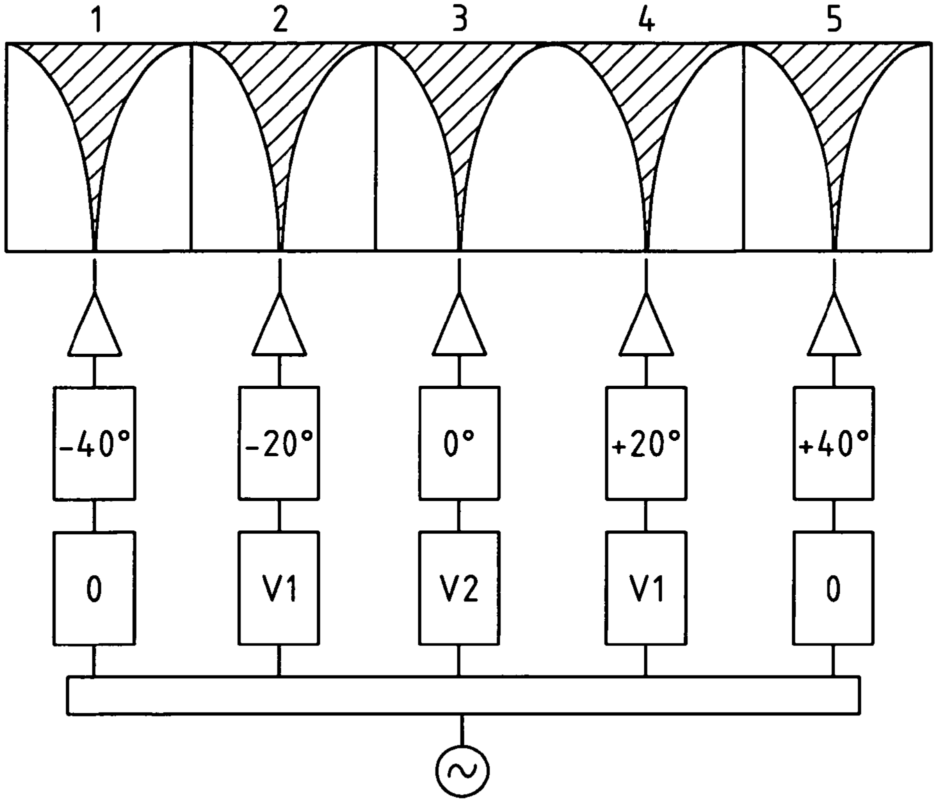
FIG. 12 illustrates schematically the embodiment for which the simulation of FIG. 11 was done.

FIGS. 10 and 11 illustrate how the emitted field can be adjusted by adjusting the phase shift and attenuation of the different signals associated with the plurality of antenna elements. The simulations were done for an embodiment with five Vivaldi antennas 1-5 located in the same direction in the same plane, see FIG. 12. By introducing appropriate phase shifts and attenuations in the signal associated with the different antenna elements the angle of opening of the beam can be changed and the flatness of the field plane can be improved. FIG. 10 illustrates the situation wherein no phase shifts or attenuations were applied. FIG. 11 illustrates the situation wherein the signals emitted by the second and fourth Vivaldi antenna elements 2, 4 were given a phase shift of −20 and +20 degrees and the first and fifth antenna elements 1, 5 were given a phase shift of −40 and +40 degrees, respectively, see also FIG. 12. Compared to the beam of FIG. 10, the beam of FIG. 11 is wider and has an improved field plane leading to an improved UFA. As illustrated in FIG. 12, to further improve the UFA it is possible to control the attenuations, applying e.g. a first attenuation V1 on the second and fourth Vivaldi antenna elements 2, 4, and a second larger attenuation V2 on the third Vivaldi antenna element 3.

Although the principles of phase shifting and attenuating have been explained above for an embodiment with Vivaldi antenna element, the skilled person understand that similar examples can be given for patch elements, using e.g. a plurality of arrays, each array comprising three patch elements in a row. In each array the middle patch element can e.g. be associated with a phase shift zero and a certain attenuation while the outer patch elements can be associated with a phase shift −x and +x degrees, respectively.

Figure 13A:
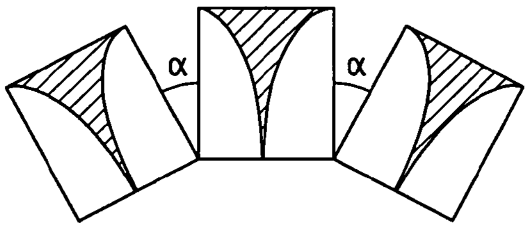
FIGS. 13A and 13B illustrate two further embodiments of the invention.
Figure 13B:
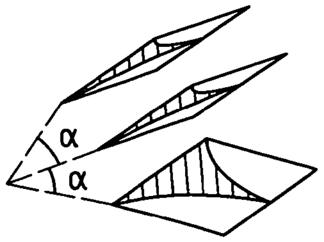

In the above disclosed embodiments the antenna elements, e.g. the Vivaldi antenna elements of FIG. 1B, are oriented in the same direction on the PCB's but the skilled person understands that the antenna elements may also be on the same plane but oriented in different directions, see e.g. FIG. 13A, or on different planes oriented in different directions, see e.g. FIG. 13B. The angle α between the different directions is preferably smaller that 60 degrees. This may be advantageous when it is desirable to increase the beam angle.

Whilst the principles of the invention have been set out above in connection with specific embodiments, it is to be understood that this description is merely made by way of example and not as a limitation of the scope of protection which is determined by the appended claims.

The invention claimed is:

1. Broadband antenna system, comprising:

a plurality of antenna elements and a plurality of amplifiers;

wherein every antenna element of said plurality of antenna elements is configured for operating in a predetermined frequency range and is associated with an amplifier of said plurality of amplifiers which is configured for said predetermined frequency range;

said plurality of antenna elements covering a broadband range;

wherein the broadband range is an operable range covering at least one octave, said broadband antenna system further comprising a controller for controlling the plurality of amplifiers in order to sequentially emit signals using the plurality of antenna elements, said sequentially emitted signals covering the full broadband range.

2. Broadband antenna system according to claim 1, wherein said plurality of antenna elements comprises a first antenna element configured for operating in a first frequency range and a second antenna element configured for operating in a second frequency range different from the first frequency range.

3. Broadband antenna system according to claim 2, wherein said plurality of antenna elements are narrowband antenna elements.

4. Broadband antenna system according to claim 1, wherein said plurality of antenna elements comprises a plurality of patch antenna arrays, said plurality of patch antenna arrays comprising at least a first antenna array configured for operating in a first frequency range and a second antenna array configured for operating in a second frequency range different from the first frequency range.

5. Broadband antenna system according to claim 1, wherein said plurality of antenna elements are broadband antenna elements.

6. Broadband antenna system according to claim 5, wherein said plurality of antenna elements comprise any one or more of the following types:

log per antenna, Vivaldi antenna, "bunny ear" antenna, or horn antenna.

7. Broadband antenna system according to claim 1, wherein the broadband range covers a frequency range from 1 to 6 GHz.

8. Broadband antenna system according to claim 1, wherein each amplifier of said plurality of amplifiers operates below 25 Watt.

9. Broadband antenna system according to claim 1, configured for emitting generated power signals, further comprising a plurality of power meters, wherein between each amplifier of the plurality of amplifiers and the corresponding antenna element, there is provided a power meter of said plurality of power meters.

10. Broadband antenna system according to claim 3, wherein said plurality of antenna elements comprise any one or more of the following types: patch antenna, dipole antenna.

11. Antenna array arrangement, comprising:

at least a first array of at least two antenna elements, and a second array of at least two antenna elements, wherein the at least two antenna elements of the first array surround the at least two antenna elements of the second array; and said first and second antenna arrays covering a broadband range, wherein the broadband range is an operable range covering at least one octave, wherein the at least two antenna elements of the first and second array are patch antennas, wherein the first array is configured to operate in a first frequency range, and the second array is configured to operate in a second frequency range different from the first frequency range, and wherein the distance between two adjacent antenna elements of the first array is approximately equal to a wavelength corresponding with the first frequency range, and wherein the distance between two adjacent antenna elements of the second array is approximately equal to a wavelength corresponding with the second frequency range.

12. Antenna array arrangement of claim 11, wherein the dimension of the at least two antenna elements of the first and second array is approximately equal to half a wave length corresponding with the first and second frequency range, respectively.

13. Antenna array arrangement of claims 11, wherein the first array comprises four rectangular antenna elements and the second array comprises four rectangular antenna elements.

14. Broadband antenna system, comprising:

a plurality of antenna elements and a plurality of amplifiers;

wherein every antenna element of said plurality of antenna elements is configured for operating in a predetermined frequency range and is associated with an amplifier of said plurality of amplifiers which is configured for said predetermined frequency range;

said plurality of antenna elements covering a broadband range;

wherein the broadband range is an operable range covering at least one octave, said broadband antenna system further comprising a controller for controlling the plurality of amplifiers in order to sequentially emit signals using the plurality of antenna elements, said sequentially emitted signals covering the full broadband range, said broadband antenna system being configured for emitting generated power signals, said broadband antenna system further comprising a plurality of power meters, wherein between each amplifier of the plurality of amplifiers and the corresponding antenna element, there is provided a power meter of said plurality of power meters.

15. Broadband antenna system according to claim 14, wherein said plurality of antenna elements comprises a first antenna element configured for operating in a first frequency range and a second antenna element configured for operating in a second frequency range different from the first frequency range.

16. Broadband antenna system according to claim 15, wherein said plurality of antenna elements are narrowband antenna elements.

17. Broadband antenna system according to claim 14, wherein said plurality of antenna elements comprises a plurality of patch antenna arrays, said plurality of patch antenna arrays comprising at least a first antenna array configured for operating in a first frequency range and a second antenna array configured for operating in a second frequency range different from the first frequency range.

18. Broadband antenna system according to claim 14, wherein said plurality of antenna elements are broadband antenna elements.

19. Broadband antenna system according to claim 18, wherein said plurality of antenna elements comprise any one or more of the following types: log per antenna, Vivaldi antenna, "bunny ear" antenna, or horn antenna.

20. Broadband antenna system according to claim 14, wherein the broadband range covers a frequency range from 1 to 6 GHz.

21. Broadband antenna system according to claim 14, wherein each amplifier of said plurality of amplifiers operates below 25 Watt.

22. Broadband antenna system according to claim 16, wherein said plurality of antenna elements comprise any one or more of the following types: patch antenna, dipole antenna.

* * * * *